United States Patent
Patra et al.

(10) Patent No.: US 7,971,115 B2
(45) Date of Patent: Jun. 28, 2011

(54) METHOD AND APPARATUS FOR DETECTING AND CORRECTING ERRORS IN A PARALLEL TO SERIAL CIRCUIT

(75) Inventors: Madan M. Patra, Santa Clara, CA (US); Paul T. Sasaki, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 209 days.

(21) Appl. No.: 12/474,248

(22) Filed: May 28, 2009

(65) Prior Publication Data

US 2010/0199136 A1    Aug. 5, 2010

Related U.S. Application Data

(60) Provisional application No. 61/148,925, filed on Jan. 31, 2009, provisional application No. 61/148,930, filed on Jan. 31, 2009.

(51) Int. Cl.
*G01R 31/28* (2006.01)
(52) U.S. Cl. .................. 714/731; 370/503; 370/537
(58) Field of Classification Search .................. 370/394, 370/535, 536, 537, 503; 714/798, 731, 744
See application file for complete search history.

(56) References Cited

U.S. PATENT DOCUMENTS

| | | | | |
|---|---|---|---|---|
| 5,062,105 A | * | 10/1991 | McKnight et al. | 370/538 |
| 5,065,396 A | * | 11/1991 | Castellano et al. | 370/536 |
| 6,581,183 B1 | * | 6/2003 | Davis et al. | 714/798 |
| 7,091,890 B1 | | 8/2006 | Sasaki et al. | |
| 7,289,589 B2 | * | 10/2007 | Pawlowski et al. | 375/369 |
| 7,593,432 B2 | * | 9/2009 | McClary et al. | 370/535 |
| 2008/0186972 A1 | * | 8/2008 | Guo | 370/394 |

FOREIGN PATENT DOCUMENTS

| | | |
|---|---|---|
| EP | 1 249 936 A2 | 10/2002 |
| JP | 10 322200 A | 12/1998 |
| WO | WO 2004-038994 A1 | 5/2004 |

* cited by examiner

*Primary Examiner* — David Ton
(74) *Attorney, Agent, or Firm* — Murray Smith (57) ABSTRACT

A circuit has first portion that receives data at a first rate; a second portion that outputs data at a second rate synchronized to and different from the first rate; a third portion that transfers data from the first portion to the second portion; and a fourth portion that generates an error detected signal in response to a disruption in the synchronism between the first and second rates. A different aspect involves a method that includes: receiving data at a first rate in a first portion; transferring data from the first portion to a second portion; outputting data at a second rate from the second portion, the second rate being synchronized to and different from the first rate; and generating an error detected signal in response to detection of a disruption in the synchronism between the first and second rates.

20 Claims, 5 Drawing Sheets

METHOD AND APPARATUS FOR DETECTING AND CORRECTING ERRORS IN A PARALLEL TO SERIAL CIRCUIT

FIELD OF THE INVENTION

The invention relates to integrated circuit devices (ICs). More particularly, the invention relates to error detection and correction in an IC.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
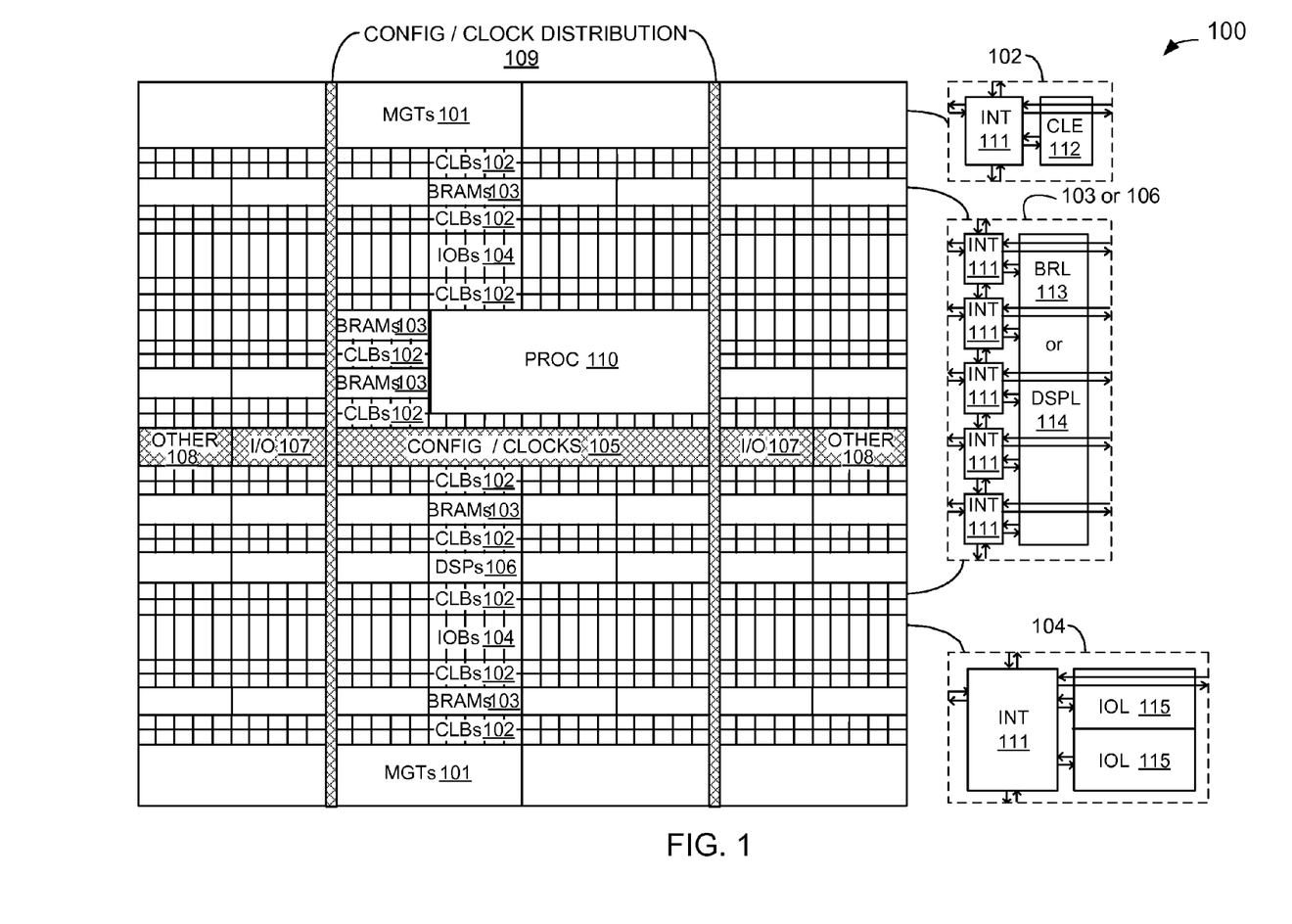
FIG. 1 is a diagrammatic view of an advanced field programmable gate array (FPGA) architecture that includes several different types of programmable logic blocks.
Figure 2:
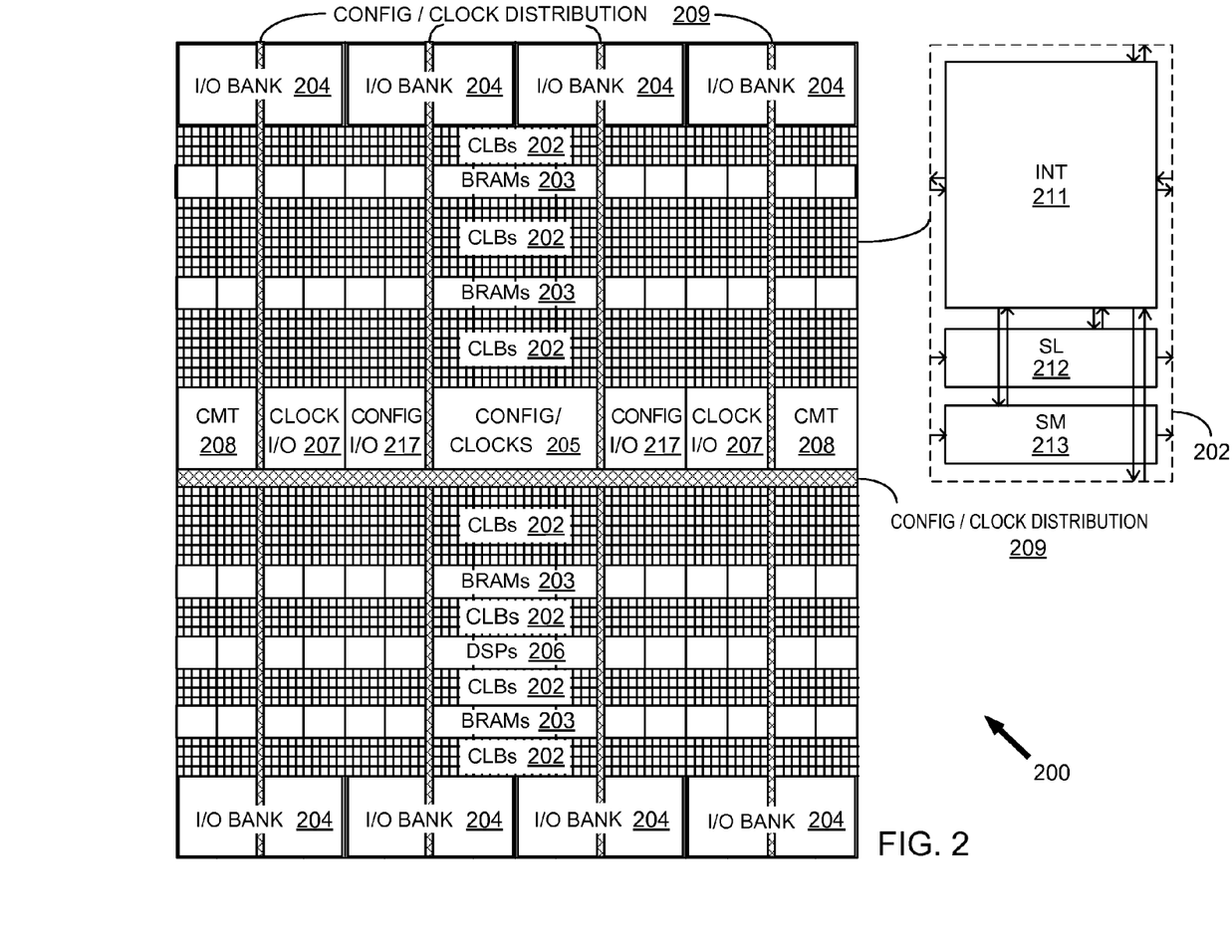
FIG. 2 is a diagrammatic view of another FPGA architecture that is an alternative embodiment of the FPGA of FIG. 1, and that includes several different types of programmable logic blocks.

An FPGA of the type shown in FIGS. 1 and 2 will often include a parallel-to-serial converter circuit. The circuit uses two clock signals, one of which is a slow clock that has one rate, and the other of which is a fast clock that has a different rate. The fast clock has a frequency that is an integer multiple of the frequency of the slow clock, where the integer is the number of bits in parallel data words supplied to the parallel-to-serial converter circuit. The circuit receives parallel data using the slow clock, and shifts this data out serially using the fast clock. For proper circuit operation, the ratio between the fast and slow clocks must be maintained. A glitch in the fast clock signal can disrupt this ratio, and thereby cause errors in the serially-transmitted data. Existing parallel-to-serial circuits are not capable of detecting this type of malfunction. Therefore, although existing parallel-to-serial converter circuits have been generally adequate for their intended purposes, they have not been entirely satisfactory in all respects.

SUMMARY

An embodiment of an apparatus can include circuitry having: a data input receiving portion that receives input data at a first rate; a data output transmitting portion that transmits output data from the circuitry at a second rate synchronized to and different from the first rate; a data transfer portion that transfers data from the data input receiving portion to the data output transmitting portion; and an error detection portion that monitors the synchronism between the first and second rates and that, in response to a disruption in the synchronism between the first and second rates, generates an error detected signal at an output.

The data input receiving portion can be responsive to a first clock signal running at the first rate, and the data output transmitting portion can be responsive to a second clock signal running at the second rate. The error detection portion can include a storage element that stores a comparison value that indicates a number of cycles of the second clock signal that should occur during a selected number of cycles of the first clock signal, and a comparator that compares the comparison value and a clock cycle value that is representative of the number of cycles of the second clock signal that have actually occurred since the clock cycle value was last equivalent to the comparison value. The comparator can have an output coupled to the output of the error detection portion.

The error detection portion can include a capture portion that is coupled between the output of the comparator and the output of the error detection portion, and that can capture a signal at the output of the comparator to serve as the error detected signal.

The capture portion can include a flip-flop having an input that is coupled to the output of the comparator, a clock input that receives the first clock signal, and an output coupled to the output of the error detection circuit.

The comparison value can have a plurality of bits, and the clock cycle value can have a plurality of bits. The comparator can include a NAND gate having an output coupled to the output of the comparator and can have a plurality of inputs, and can include a plurality of exclusive NOR gates. Each of the plurality of exclusive NOR gates can have an input that receives a respective bit of the comparison value in the storage element, another input that receives a respective bit of the clock cycle value, and an output coupled to a respective input of the NAND gate.

The error detection portion can include a capture portion that is coupled between the output of the comparator and the output of the error detection portion, and that captures a signal at the output of the comparator to serve as the error detected signal.

The capture portion can include a flip-flop having an input that is coupled to the output of the comparator, a clock input that receives the first clock signal, and an output coupled to the output of the error detection circuit.

The data transfer portion can include a load signal generator that generates a load signal in response to an occurrence of a number of cycles of the second clock signal that should occur in the selected number of cycles of the first clock signal, the load signal causing the data output transmitting portion to receive data from the data input receiving portion.

The data output transmitting portion can include a shift register having a plurality of inputs coupled to the data input receiving portion, a control input responsive to the load signal, a clock input responsive to the second clock signal, and an output. The plurality of inputs of the shift register can receive in parallel respective bits of data from the data input receiving portion in response to an occurrence of the load signal at the control input, and the shift register can output data serially at its output in response to the second clock signal and in the absence of an occurrence of the load signal at the control input.

The data input receiving portion can be responsive to a first clock running at the first rate, and the data output transmitting portion is responsive to a second clock running at the second rate.

The data input receiving portion can receive the input data in parallel. The data transfer portion can cause data to be transferred in parallel from the data input receiving portion to the data output transmitting portion. The data output transmitting portion can transmit the output data serially. The second rate can be greater than the first rate.

An embodiment of a method can includes: receiving data at a first rate at the data input receiving portion; transferring data from the data input receiving portion to the data output transmitting portion; outputting data at a second rate from the data output transmitting portion, the second rate being synchronized to and different from the first rate; monitoring the synchronism between the first and second rates, including detecting disruption in the synchronism if a disruption occurs; and generating an error detected signal in response to detecting a disruption in the synchronism.

The method can include operating the data input receiving portion in response to a first clock signal running at the first rate, and operating the data output transmitting portion in response to a second clock signal running at the second rate. The monitoring can include maintaining a comparison value that indicates a number of cycles of the second clock signal that should occur during a selected number of cycles of the first clock signal. In addition, the monitoring can include maintaining a clock cycle value that is representative of the number of cycles of the second clock signal that have actually occurred since a point in time when the clock cycle value was last equivalent to the comparison value, and can include comparing the comparison and clock cycle values. The generating of the error detected signal can be carried out as a function of the result of the comparing.

Generating of the error detected signal can occur in response to the comparing indicating that the comparison and clock cycle values are different.

Generating of the error detected signal can be synchronized to an edge of the first clock signal.

The method can include generating a load signal in response to an occurrence of a number of cycles of the second clock signal that should occur in the selected number of cycles of the first clock signal. In addition, the method can include configuring the data output transmitting portion to have a shift register, the shift register receiving data from the data input receiving portion in response to an occurrence of the load signal, and the shift register outputting data serially in response to the second clock signal and in the absence of an occurrence of the load signal.

The method can include operating the data input receiving portion in response to a first clock signal running at the first rate, and operating the data output transmitting portion in response to a second clock signal running at the second rate.

The receiving can include receiving data in parallel and the transferring can include transferring data in parallel, the outputting can include outputting data serially, and the second rate can be greater than the first rate.

Another embodiment of the apparatus can include circuitry having: a data input receiving portion that receives input data at a first clock rate; a data output transmitting portion that transmits output data from the circuitry at a second clock rate synchronized to and different from the first clock rate; a programmable load generator, coupled to the data input receiving portion and the data output transmitting portion, that includes a counter, wherein the counter is driven by the second clock rate; a register that includes a value; a comparator, coupled to the programmable load generator and the register, to compare the value with an output of the counter; and a control circuit, coupled to the comparator, to examine an output of the comparator at a falling edge of a first clock running at the first clock rate to determine if a ratio between the first clock rate and the second clock rate has been disrupted.

The control circuit can output a reset signal if the ratio between the first clock rate and the second clock rate has been disrupted.

DETAILED DESCRIPTION

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

FIG. 2 shows an alternative embodiment of the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
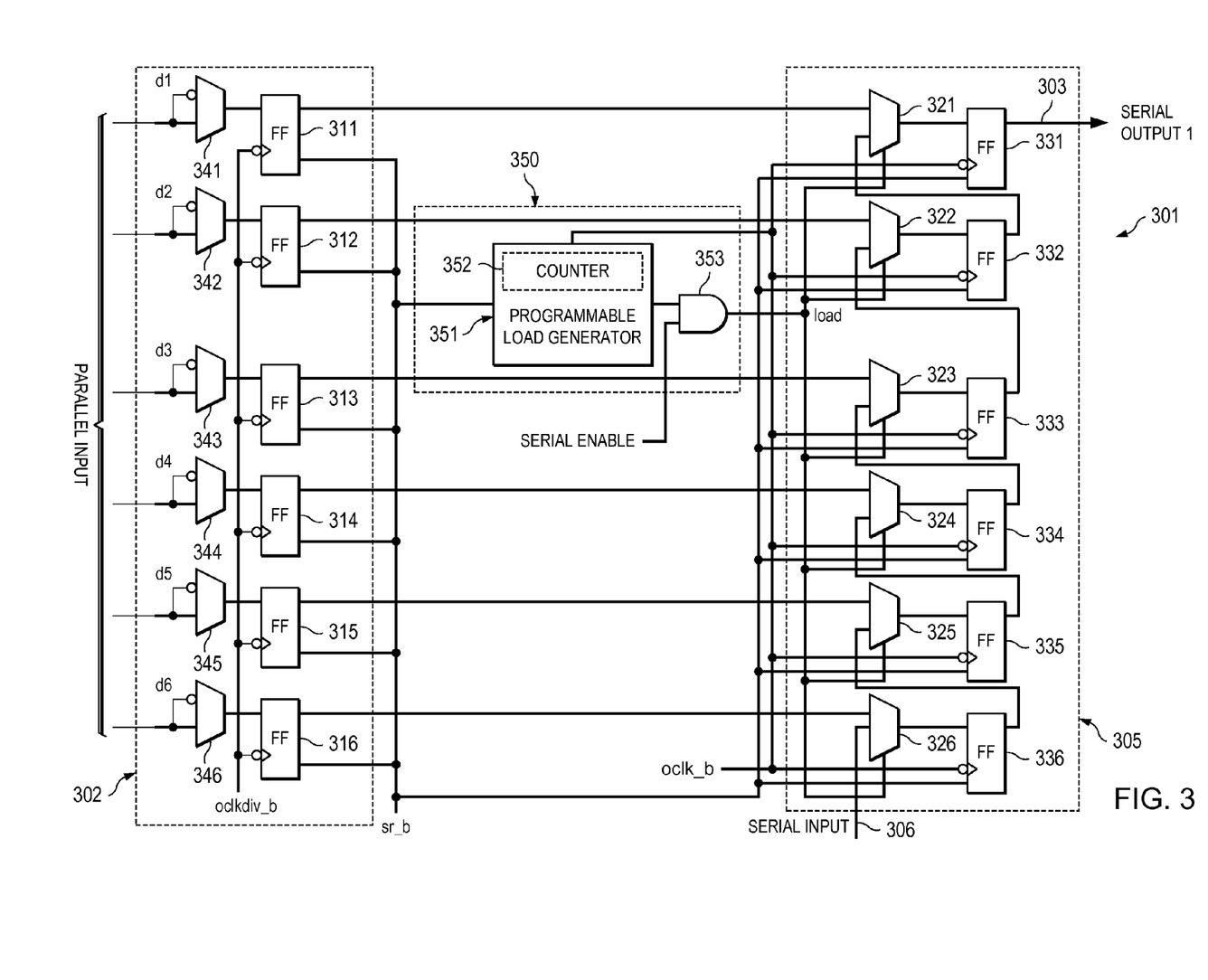
FIG. 3 is a circuit schematic showing a parallel-to-serial converter circuit that is a portion of each of the FPGA architectures of FIGS. 1 and 2.

FIG. 3 is a circuit schematic showing a parallel-to-serial converter circuit 301 that is a portion of each of the FPGA architectures of FIGS. 1 and 2. At the left side of FIG. 3, the circuit 301 has a data input receiving portion 302 that receives input data words in parallel, where each word can contain up to 6 data bits d1 to d6. The circuit 301 also has a data output transmitting portion 305 that then outputs each such word as output data in serial format, at a serial output 303. The circuit 301 is a 6-bit slice, and can handle parallel words that are from 2 bits to 6 bits in width. For example, a 4-bit word would be supplied on data inputs d1 to d4, and would be output serially at the serial output 303. A 6-bit word would be supplied on data inputs d1 to d6, and would be output serially at the serial output 303. In addition, to handle parallel words with a size greater than 6 bits, the circuit 301 can be cascaded with another identical circuit, including connection of the serial output 303 of one such circuit to a serial input 306 of the other circuit.

Turning now to the internal structure of the circuit 301, assume for the sake of this discussion that parallel input words supplied to the data input receiving portion 302 have a width of 6 bits. The data input receiving portion 302 has the data inputs d1 to d6, and an input register defined by 6 D-type flip-flops 311 to 316. Each 6-bit input word is supplied in parallel format to the data inputs d1 to d6, passes through six 2-to-1 selectors 341-346, and is loaded into the input register (flip-flops 311 to 316). As discussed above, FPGA architectures of the type shown in FIGS. 1 and 2 have some capability to be configured or programmed by an end user. As part of this programming process, a user will configure each of the selectors 341 to 346 to provide to the associated flip-flop 311 to 314 either an inverted or non-inverted version of the signal present at the associated data input d1 to d6. For the purpose of this discussion, it is assumed that the selectors 341 to 346 have been configured by a user to be non-inverting.

After a six-bit data word has been loaded into the input register (flip-flops 311-316), then at a suitable point in the operating sequence of the circuit 301 (discussed in more detail later), this 6-bit word is transferred in parallel to the data output transmitting portion 305. The data output transmitting portion 305 includes six 2-to-1 selectors 321 to 326, and a register defined by six D-type flip-flops 331 to 336. The 6-bit word is received in parallel through the 2-to-1 selectors 321 to 326, and is loaded into the register (flip-flops 331 to 336). After the flip-flops 331-336 have been loaded, the 2-to-1 selectors 321-326 are switched over to an alternate mode, in which the selectors 321-325 supply to the data input of each flip-flop 331 to 335 the output of respective one of the flip-flops 332 to 336, while the selector 326 supplies to the data input of the flip-flop 336 the state at serial input 306 (which as noted above can optionally be coupled to the serial output 304 of another circuit 301). As a result, the flip-flops 331-336 then function as a serial shift register, and the data in them is output serially at the serial output 303.

A clock signal oclkdiv_b is supplied to the clock input of each of the flip-flops 311 to 316, and a different clock signal oclk_b is supplied to the clock input of each of the flip-flops 331 to 336. The clock signal oclk_b for the flip-flops 331 to 336 has a frequency that is an integer multiple of the clock signal oclkdiv_b for the flip-flops 311 to 316, where the integer is equal to the number of bits in a parallel word. Thus, since it has been assumed for the purpose of this discussion that the circuit 301 is supplied with parallel words that have 6 bits, the clock oclk_b would have a frequency or rate that is 6 times the frequency or rate of the clock signal oclkdiv_b. For convenience, the clock signal oclk_b is sometimes referred to herein as a fast clock, and the clock signal oclkdiv_b is sometimes referred to herein as a slow clock.

Figure 4:
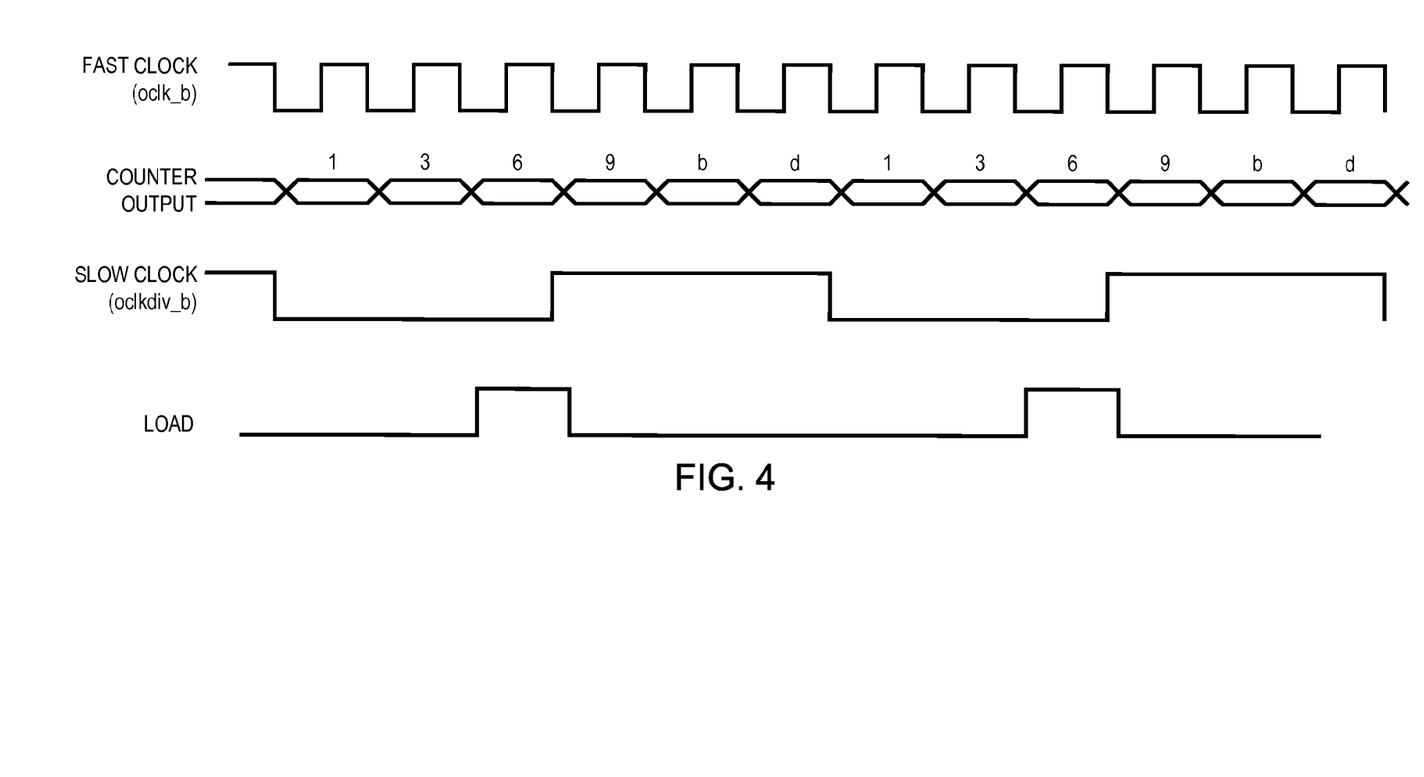
FIG. 4 is a timing diagram showing aspects of the operation of the circuit of FIG. 3.

The circuit 301 has a data transfer portion 350 that includes a programmable load generator 351. The programmable load generator 351 includes a 4-bit clock cycle counter 352 that receives the same clock signal oclk_b as the flip-flops 331 to 336. The load generator 351 has an output at which it produces one output pulse for every X pulses of the clock signal oclk_b, where X is the number of bits in the parallel input word. For purposes of the present discussion, X is 6 pulses. The data transfer portion 350 also includes an AND gate 353 having one input that receives the output from the load generator 351, and another input that receives a control signal SERIAL ENABLE. When parallel-to-serial conversion is utilized, the signal SERIAL ENABLE is always a logic high. The output of the AND gate 353 serves as a LOAD signal that is supplied as a control signal to each of the 2-to-1 selectors 321 to 326. The programmable load generator 351 and the AND gate 353 together serve as a load signal generator. When the LOAD signal is deactuated, the selectors 321 to 326 are set so that the flip-flops 331-336 function as a serial shift register for 5 clock cycles. Upon actuation of the LOAD signal, the selectors 321 to 326 switch to the parallel load mode for one clock cycle, so that the flip-flops 331 to 336 can be loaded in parallel with data from the flip-flops 311 to 316. The circuit 301 has a reset signal sr_b that is supplied to the programmable load generator 351, to each of the flip-flops 311 to 316, and to each of the flip-flops 331 to 336. FIG. 4 is a timing diagram showing aspects of the operation of circuit 301.

As discussed above, FPGA architectures of the type shown in FIGS. 1 and 2 have some capability to be configured or programmed by an end user. As part of this programming process, a user will configure the programmable load generator 351 in a manner consistent with the number of bits X in a parallel data word. Thus, if a parallel data word has X=4 bits, the programmable load generator 351 will be configured to output one pulse for every 4 pulses of the fast clock ockl_b. If a parallel word has X=6 bits, the load generator 351 will be configured to output one pulse for every 6 pulses of the fast clock ockl_b. If a parallel word has X=10 bits, load generator 351 will be configured to output one pulse for every 10 pulses of the fast clock ockl_b.

For the circuit 301 to operate properly, the ratio between the rate of the slow clock oclkdiv_b and the fast clock oclk_b must be maintained. If there is any irregularity or "glitch" in the fast clock oclk_b, the ratio will be disturbed, and will disrupt the synchronism between the register containing flip-flops 311 to 316 and the register containing flip-flops 331 to 336.

Figure 5:
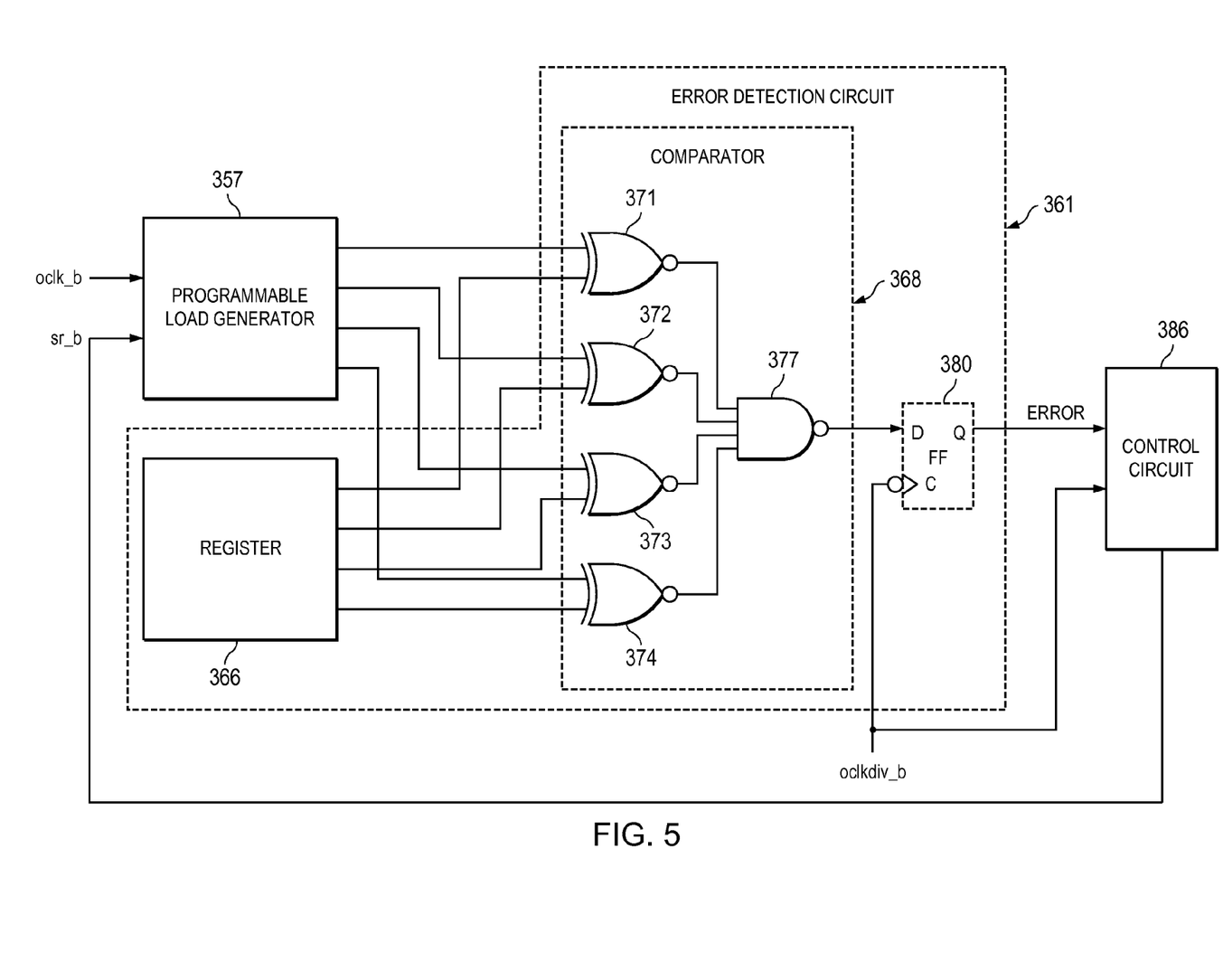
FIG. 5 is a circuit schematic showing a programmable load generator that is a component of the circuit of FIG. 3, and an error detection circuit that will detect a disruption in the ratio between fast and slow clocks used within the circuit of FIG. 3.

FIG. 5 is a circuit schematic showing the programmable load generator 351, and an error detection circuit 361 that is not shown in FIG. 3, but that is a portion of the circuit 301 of FIG. 3. The error detection circuit 361 will detect a disruption in the ratio between the rate of the slow clock oclkdiv_b (FIG. 3) and the fast clock ockl_b. The circuit 361 includes a 4-bit register 366 that is a storage element. In the disclosed embodiment, the register 366 is implemented with four memory cells that are not separately illustrated. As discussed above, FPGA architectures of the type shown in FIGS. 1 and 2 have some capability to be configured or programmed by an end user. As part of this programming process, the user will specify a 4-bit binary comparison value that is to be permanently stored in the register 366. It will be noted in FIG. 4 that, just before each falling edge of the slow clock oclkdiv_b, the load generator 351 will always be outputting the same 4-bit clock cycle value (represented in FIG. 4 as a hexadecimal "d"), provided there has been no disruption in the ratio between the fast and slow clocks. When the FPGA architecture is being configured, the register 366 in FIG. 5 is programmed to contain bits representing the same hexadecimal value "d". Although FIGS. 3 and 4 show the parallel-to-serial converter circuit operating in a single data rate ("SDR") mode, one or more embodiments of this invention also applies if the parallel-to-serial-converter circuit is configured to operate in the double data rate ("DDR") mode.

The error detection circuit 361 includes a comparator circuit 368. The comparator circuit 368 includes four exclusive NOR gates 371 to 374. As mentioned above, the load generator 351 contains a 4-bit clock cycle counter, and each of the 4 bits of this counter is coupled to one input of a respective one of the four gates 371 to 374. Each of the four memory cells in the register 366 is coupled to the other input of a respective one of the gates 371 to 374. The comparator 368 further includes a NAND gate 377 having an output, and having four inputs that are each coupled to the output of a respective one of the gates 371 to 374. The error detection circuit 361 can optionally include a D-type flip-flop 380 that is discussed later. This flip-flop is shown in broken lines in order to reflect the fact that it is optional. For the moment, it is assumed that the flip-flop 380 is not present. The output of the NAND gate 377 is an error detected signal that is supplied to a control circuit 386 for the parallel-to-serial converter circuit 301.

The control circuit 386 examines the output state that the comparator 368 has at the falling edge of each slow clock. If the output of the comparator 368 is a binary "0" (because the comparison and the clock cycle values are equivalent), then the ratio of the fast and slow clocks has not been disrupted, and the circuit 301 should be operating properly. On the other hand, if the output of the comparator 368 is a binary "1" (because the comparison and clock cycle values are different), then the ratio of the fast and slow clocks has been disrupted, for example due to a glitch in the fast clock. The control circuit 386 can then supply a reset signal to the circuit 301, or at least to the load generator 351, and then resend the 6-bit parallel data words for at least the last three slow clock cycles, in order to ensure that the entire data stream is correctly transmitted serially through the serial output of the circuit 301.

As mentioned above, the flip-flop 380 can optionally be provided. When the flip-flop 380 is present, its data input is coupled to the output of the comparator 368, its clock input receives the slow clock oclkdiv_b, and its data output is coupled to the control circuit 386. When the flip-flop 380 is present, the output of the comparator 368 is captured in the flip-flop 380 at each falling edge of the slow clock signal oclkdiv_b. The flip-flop 380 thus serves as a capture portion, and the output of the comparator 368 that is captured in the flip-flop 380 serves as the error detected signal.

Although selected embodiments have been illustrated and described in detail, it should be understood that substitutions and alterations are possible without departing from the spirit and scope of the present invention, as defined by the claims that follow.

What is claimed is:

1. An apparatus comprising circuitry having:
   a data input receiving portion that receives input data at a first rate;
   a data output transmitting portion that transmits output data from the circuitry at a second rate synchronized to and different from the first rate;
   a data transfer portion that transfers data from the data input receiving portion to the data output transmitting portion; and
   an error detection portion that has an output, that monitors the synchronism between the first and second rates and that, in response to a disruption in the synchronism between the first and second rates, generates an error detected signal at the output.

2. An apparatus according to claim 1,
   wherein the data input receiving portion is responsive to a first clock signal running at the first rate, and the data output transmitting portion is responsive to a second clock signal running at the second rate; and
   wherein the error detection portion includes a storage element that stores a comparison value that indicates a number of cycles of the second clock signal that should occur during a selected number of cycles of the first clock signal, and a comparator that compares the comparison value and a clock cycle value that is representative of the number of cycles of the second clock signal that have actually occurred since the clock cycle value was last equivalent to the comparison value, the comparator having an output coupled to the output of the error detection portion.

3. An apparatus according to claim 2, wherein the error detection portion includes a capture portion that is coupled between the output of the comparator and the output of the error detection portion, and that captures a signal at the output of the comparator to serve as the error detected signal.

4. An apparatus according to claim 3, wherein the capture portion includes a flip-flop having an input that is coupled to the output of the comparator, a clock input that receives the first clock signal, and an output coupled to the output of the error detection circuit.

5. An apparatus according to claim 2,
   wherein the comparison value has a plurality of bits, and the clock cycle value has a plurality of bits; and
   wherein the comparator includes a NAND gate having an output coupled to the output of the comparator and having a plurality of inputs, and includes a plurality of exclusive NOR gates, wherein each of the plurality of exclusive NOR gates has an input that receives a respective bit of the comparison value in the storage element, another input that receives a respective bit of the clock cycle value, and an output coupled to a respective input of the NAND gate.

6. An apparatus according to claim 5, wherein the error detection portion includes a capture portion that is coupled between the output of the comparator and the output of the error detection portion, and that captures a signal at the output of the comparator to serve as the error detected signal.

7. An apparatus according to claim 6, wherein the capture portion includes a flip-flop having an input that is coupled to the output of the comparator, a clock input that receives the first clock signal, and an output coupled to the output of the error detection circuit.

8. An apparatus according to claim 2, wherein the data transfer portion includes a load signal generator that generates a load signal in response to an occurrence of a number of cycles of the second clock signal that should occur in the selected number of cycles of the first clock signal, the load signal causing the data output transmitting portion to receive data from the data input receiving portion.

9. An apparatus according to claim 8, wherein the data output transmitting portion includes a shift register having a plurality of inputs coupled to the data input receiving portion, a control input responsive to the load signal, a clock input responsive to the second clock signal, and an output, the plurality of inputs of the shift register receiving in parallel respective bits of data from the data input receiving portion in response to an occurrence of the load signal at the control input, and the shift register outputting data serially at its output in response to the second clock signal and in the absence of an occurrence of the load signal at the control input.

10. An apparatus according to claim 1, wherein the data input receiving portion is responsive to a first clock running at the first rate, and the data output transmitting portion is responsive to a second clock running at the second rate.

11. An apparatus according to claim 10,
    wherein the data input receiving portion receives the input data in parallel;
    wherein the data transfer portion causes data to be transferred in parallel from the data input receiving portion to the data output transmitting portion;
    wherein the data output transmitting portion transmits the output data serially; and
    wherein the second rate is greater than the first rate.

12. A method of operating a circuit having a data input receiving portion and a data output transmitting portion, the method comprising:
    receiving data at a first rate at the data input receiving portion;
    transferring data from the data input receiving portion to the data output transmitting portion;
    outputting data at a second rate from the data output transmitting portion, the second rate being synchronized to and different from the first rate;
    monitoring the synchronism between the first and second rates, including detecting disruption in the synchronism if a disruption occurs; and
    generating an error detected signal in response to detecting a disruption in the synchronism.

13. A method according to claim 12,
    including operating the data input receiving portion in response to a first clock signal running at the first rate, and operating the data output transmitting portion in response to a second clock signal running at the second rate;
    wherein the monitoring includes maintaining a comparison value that indicates a number of cycles of the second clock signal that should occur during a selected number of cycles of the first clock signal, includes maintaining a clock cycle value that is representative of the number of cycles of the second clock signal that have actually occurred since a point in time when the clock cycle value was last equivalent to the comparison value, and includes comparing the comparison and clock cycle values; and
    wherein the generating of the error detected signal is carried out as a function of the result of the comparing.

14. A method according to claim 13, wherein the generating of the error detected signal occurs in response to the comparing indicating that the comparison and clock cycle values are different.

15. A method according to claim 14, wherein the generating of the error detected signal is synchronized to an edge of the first clock signal.

16. A method according to claim 14,
including generating a load signal in response to an occurrence of a number of cycles of the second clock signal that should occur in the selected number of cycles of the first clock signal; and
including configuring the data output transmitting portion to have a shift register, the shift register receiving data from the data input receiving portion in response to an occurrence of the load signal, and the shift register outputting data serially in response to the second clock signal and in the absence of an occurrence of the load signal.

17. A method according to claim 12, including operating the data input receiving portion in response to a first clock signal running at the first rate, and operating the data output transmitting portion in response to a second clock signal running at the second rate.

18. A method according to claim 17,
wherein the receiving includes receiving data in parallel;
wherein the transferring includes transferring data in parallel;
wherein the outputting includes outputting data serially; and
wherein the second rate is greater than the first rate.

19. An apparatus comprising circuitry having:
a data input receiving portion that receives input data at a first clock rate;
a data output transmitting portion that transmits output data from the circuitry at a second clock rate synchronized to and different from the first clock rate;
a programmable load generator, coupled to the data input receiving portion and the data output transmitting portion, that includes a counter, wherein the counter is driven by the second clock rate;
a register that includes a value;
a comparator, coupled to the programmable load generator and the register, to compare the value with an output of the counter; and
a control circuit, coupled to the comparator, to examine an output of the comparator at a falling edge of a first clock running at the first clock rate to determine if a ratio between the first clock rate and the second clock rate has been disrupted.

20. An apparatus according to claim 19,
wherein the control circuit outputs a reset signal if the ratio between the first clock rate and the second clock rate has been disrupted.

* * * * *